(12) United States Patent
Guo et al.

(10) Patent No.: US 10,508,324 B2
(45) Date of Patent: Dec. 17, 2019

(54) THERMOELECTRIC CONVERSION MATERIAL AND THERMOELECTRIC CONVERSION MODULE

(75) Inventors: Junqing Guo, Tsukuba (JP); Shunichi Ochi, Tsukuba (JP); Huiyuan Geng, Tsukuba (JP); Takahiro Ochi, Tsukuba (JP); Satoru Ito, Tsukuba (JP)

(73) Assignee: FURUKAWA CO., LTD., Tokyo (JP)

( * ) Notice: Subject to any disclaimer, the term of this patent is extended or adjusted under 35 U.S.C. 154(b) by 632 days.

(21) Appl. No.: 12/864,068

(22) PCT Filed: Jan. 22, 2009

(86) PCT No.: PCT/JP2009/000224
§ 371 (c)(1),
(2), (4) Date: Jul. 22, 2010

(87) PCT Pub. No.: WO2009/093455
PCT Pub. Date: Jul. 30, 2009

(65) Prior Publication Data
US 2010/0294326 A1    Nov. 25, 2010

(30) Foreign Application Priority Data

Jan. 23, 2008 (JP) .................... 2008-012213
Mar. 13, 2008 (JP) .................... 2008-064358

(51) Int. Cl.
*C22C 19/07* (2006.01)
*H01L 35/16* (2006.01)
(Continued)

(52) U.S. Cl.
CPC ............ *C22C 19/07* (2013.01); *H01L 35/16* (2013.01); *C22C 1/0441* (2013.01); *H01L 35/04* (2013.01); *H01L 35/20* (2013.01)

(58) Field of Classification Search
CPC ......... H01L 35/18; H01L 35/20; H01L 35/00; H01L 35/32; H01L 35/34; H01L 35/14; H01L 35/16; H01L 35/04; C22C 19/07
(Continued)

(56) References Cited

U.S. PATENT DOCUMENTS 6,069,312 A    5/2000  Fleurial et al.
6,342,668 B1 *  1/2002  Fleurial et al. ............... 136/238
(Continued)

FOREIGN PATENT DOCUMENTS

JP    11-103098       4/1999
JP    11-135840 A     5/1999
(Continued)

OTHER PUBLICATIONS

Guo Junqing et al., "Skutterudite Yb—(Co,Fe)—Sb-kei Netsuden Zairyo ni Okeru Ishu Genso Tenka Koka," Japan Society of Applied Physics, vol. 67, No. 1, Aug. 29, 2006, p. 224.
(Continued)

*Primary Examiner* — Andrew J Golden
(74) *Attorney, Agent, or Firm* — Rankin, Hill & Clark LLP

(57) ABSTRACT

A thermoelectric conversion material having excellent thermoelectric performance over a wide temperature range, and a thermoelectric conversion module providing excellent junctions between thermoelectric conversion materials and electrodes. An R-T-M-X-N thermoelectric conversion material has a structure expressed by the following formula: $R_r T_{t-m} M_m X_{x-n} N_n$ ($0 \leq r \leq 1$, $3 \leq t-m \leq 5$, $0 \leq m \leq 0.5$, $10 \leq x \leq 15$, $0 \leq n \leq 2$), where R represents three or more elements selected from the group consisting of rare earth elements, alkali metal elements, alkaline-earth metal elements, group 4 elements, and group 13 elements, T represents at least one element selected from Fe and Co, M represents at least one element
(Continued)

selected from the group consisting of Ru, Os, Rh, Ir, Ni, Pd, Pt, Cu, Ag, and Au, X represents at least one element selected from the group consisting of P, As, Sb, and Bi, and N represents at least one element selected from Se and Te.

10 Claims, 6 Drawing Sheets

(51) Int. Cl.
    *H01L 35/20*     (2006.01)
    *H01L 35/04*     (2006.01)
    *C22C 1/04*     (2006.01)

(58) Field of Classification Search
    USPC .................................... 136/236.1, 238, 239
    See application file for complete search history.

(56) References Cited

U.S. PATENT DOCUMENTS

| | | | |
|---|---|---|---|
| 6,700,053 B2* | 3/2004 | Hara et al. | 136/236.1 |
| 7,732,704 B2 | 6/2010 | Funahashi | |
| 8,444,915 B2 | 5/2013 | Berardan | |
| 2002/0053662 A1* | 5/2002 | Wu | H01L 35/225 |
| | | | 252/518.1 |
| 2002/0179135 A1* | 12/2002 | Shutoh et al. | 136/200 |
| 2005/0229963 A1* | 10/2005 | He et al. | 136/236.1 |
| 2006/0118159 A1* | 6/2006 | Tsuneoka et al. | 136/211 |
| 2007/0034245 A1* | 2/2007 | Nakajima | 136/236.1 |
| 2007/0125412 A1 | 6/2007 | Funahashi | |
| 2008/0023057 A1 | 1/2008 | Nakajima et al. | |
| 2008/0236644 A1* | 10/2008 | Sakurada | H01L 35/22 |
| | | | 136/239 |
| 2009/0208364 A1 | 8/2009 | Alleno | |

FOREIGN PATENT DOCUMENTS

| | | |
|---|---|---|
| JP | 2000-252526 | 9/2000 |
| JP | 2001-135865 | 5/2001 |
| JP | 2002-026400 | 1/2002 |
| JP | 2002-026401 | 1/2002 |
| JP | 2002-033527 | 1/2002 |
| JP | 2003-092435 | 3/2003 |
| JP | 2003-309294 | 10/2003 |
| JP | 2006-049736 | 2/2006 |
| JP | 2006-086512 | 3/2006 |
| JP | 2006-089847 | 4/2006 |
| JP | 2006-128522 | 5/2006 |
| JP | 2006-156993 | 6/2006 |
| JP | 2007-005544 | 1/2007 |
| WO | 2005036661 A1 | 4/2005 |
| WO | 2005/104255 | 11/2005 |
| WO | 2006106116 A2 | 10/2006 |

OTHER PUBLICATIONS

International Search Report for corresponding PCT/JP2009/000224 dated Mar. 3, 2009, two pages.
Extended European Search Report dated Oct. 30, 2012, Applicant—Furukawa Co., Ltd., Application No. 09704752.6, 5 Pages.
Japanese Patent Office Action dated Mar. 5, 2013 filed in the corresponding Japanese patent application No. 2009-550473.
Japanese Office Action dated Jan. 7, 2014 filed in the corresponding Japanese Patent Application No. 2009-550473.
Tang, Xinfeng et al. "Synthesis and thermoelectric properties of double-atom-filled skutterudite compounds $Ca_mCe_nFe_xCo_{4-x}Sb_{12}$," Journal of Applied Physics, 100, 123702, 2006, pp. from 123702-1 to 123702-8.; Cited in Japanese Office Action.
Japanese Office Action dated May 28, 2013 filed in the corresponding Japanese patent application No. 2009-550473.
Japanese Office Action dated Mar. 31, 2015 issued in the corresponding Japanese patent application No. 2014-077936.

\* cited by examiner

THERMOELECTRIC CONVERSION MATERIAL AND THERMOELECTRIC CONVERSION MODULE

TECHNICAL FIELD

The present invention relates to a thermoelectric conversion material and a thermoelectric conversion module that is capable of converting thermal energy directly into electricity, or electricity directly into thermal energy.

BACKGROUND ART

A thermoelectric conversion material is a material that is capable of converting thermal energy directly into electricity or electrical energy directly into thermal energy, and, in other words, is capable of heating and cooling by applying electricity. A thermoelectric conversion module is formed by electrically connecting in series a large number of pairs of p/n thermoelectric conversion materials, each of which is a combination of a p-type thermoelectric conversion material and an n-type thermoelectric conversion material. With the use of a thermoelectric conversion module, waste heat, which has not been used often, can be converted into electricity to make effective use of energy.

The performance of a thermoelectric conversion material is assessed by its figure of merit Z. The figure of merit Z is expressed by the following formula (1), in which a Seebeck coefficient S, thermal conductivity κ, and electric resistivity ρ are used:

$$Z = S^2/(\kappa \rho) \quad (1)$$

The performance of a thermoelectric conversion material is also assessed by the product of its figure of merit Z and temperature T. In this case, both sides of the formula (1) are multiplied by the temperature T (T being absolute temperature) to obtain the following formula (2):

$$ZT = S^2 T/(\kappa \rho) \quad (2)$$

ZT in the formula (2) is called a dimensionless figure of merit, and serves as an indicator of the performance of the thermoelectric conversion material. A thermoelectric conversion material with a larger ZT has better thermoelectric performance at the temperature T. According to the formulas (1) and (2), an excellent thermoelectric conversion material is a material that is capable of increasing the value of the figure of merit Z, that is a material that has a larger Seebeck coefficient S, low thermal conductivity κ and small electric resistivity ρ.

Also, when the performance of a thermoelectric conversion material is assessed from an electrical point of view, the electrical power factor P expressed by the following formula (3) is used in some cases:

$$P = S^2/\rho \quad (3)$$

The highest conversion efficiency $\eta_{max}$ of a thermoelectric conversion material is expressed by the following formula (4):

$$\eta_{max} = \{(T_h - T_c)/T_h\}\{(M-1)/(M+1)(T_c/T_h))\} \quad (4)$$

M in the formula (4) is expressed by the following formula (5), where $T_h$ represents the temperature of the hot side of the thermoelectric conversion material, and $T_c$ represents the temperature of the cold side of the thermoelectric conversion material:

$$M = \{1 + Z(T_h + T_c)/2\}^{-0.5} \quad (5)$$

According to the above formulas (1) to (5), it is known that the higher the figure of merit and the temperature difference between the hot side and the cold side, the larger the thermoelectric conversion efficiency of a thermoelectric conversion material.

Typical examples of thermoelectric conversion materials to be used in thermoelectric conversion modules that have been studied thus far include $Bi_2Te_3$-based materials, PbTe-based materials, $AgSbTe_2$—GeTe-based materials, SiGe-based materials, (Ti, Zr, Hf) NiSn-based materials, $CoSb_3$-based materials, $Zn_4Sb_3$-based materials, $FeSi_2$-based materials, $B_4C$-based materials, $NaCo_2O_4$-based oxides, and $Ca_3Co_4O_9$-based oxides. However, only $Bi_2Te_3$-based materials among these materials have been put into practical use. The highest working temperature of the thermoelectric conversion modules containing $Bi_2Te_3$-based thermoelectric conversion materials used for power generation is limited to 250° C., which is the highest temperature the $Bi_2Te_3$-based materials can endure.

To effectively use various kinds of waste heat, there has been a demand for thermoelectric conversion modules that can be used at intermediate temperatures ranging from 300 to 600° C. In recent years, attention is drawn to a filled skutterudite thermoelectric conversion material that can be used in this temperature range. A filled skutterudite compound is expressed by the chemical formula $RT_4X_{12}$ (R being a metal, T being a transition metal, X being pnictogen), and has a cubic structure of the space group $Im^{-3}$. In this formula, R represents an alkaline-earth metal, a lanthanoid, or an actinoid, T represents a transition metal such as Fe, Ru, Os, Co, Pd, or Pt, and X represents a pnictogen element such as As, P, or Sb. Particularly, studies are being actively made on filled skutterudite thermoelectric conversion materials having Sb as X.

La(Ce)—Fe—Sb or Yb—Co—Sb skutterudite thermoelectric conversion materials that have been developed, particularly, p-type $CeFe_4Sb_{12}$, p-type $La_xFe_3CoSb_{12}$ (0<x≤1), and n-type $Yb_yCo_4Sb_{12}$ (0<y≤1) thermoelectric conversion materials, have relatively good thermoelectric performance at intermediate temperatures ranging from 300 to 600° C. As for such thermoelectric performance, it is described that the dimensionless figure of merit ZT is 0.9 to 1.4 in Patent Document 1, and that is 0.7 to 0.8 in Patent Document 2.

However, to produce a thermoelectric conversion module having high thermoelectric conversion efficiency, a thermoelectric conversion material having a higher dimensionless figure of merit ZT over a wide temperature range is required. When the inventors conducted an additional test based on Patent Document 1, the dimensionless figure of merit ZT of the p-type $CeFe_4Sb_{12}$ thermoelectric material disclosed in Patent Document 1 was 0.5 to 0.6 at 450° C. Therefore, the dimensionless figure of merit ZT did not reach the ZT value of 1.4 disclosed in Patent Document 1. On the other hand, the dimensionless figure of merit ZT of an n-type thermoelectric material being able to be used at temperatures ranging from room temperature to 600° C. is 0.5 at 200° C., 0.6 at 300° C., and 0.8 at 500° C. Therefore, the value of the dimensionless figure of merit ZT indicating the thermoelectric performance is small at temperatures ranging from room temperature to 600° C., particularly ZT is much smaller at temperature below 300° C. As described above, with the conventional materials, it is difficult to achieve a higher dimensionless figure of merit ZT over a wide temperature range.

Meanwhile, to produce thermoelectric conversion modules that can be used at intermediate temperatures ranging from 300 to 600° C., selecting the electrode material to connect a p-type thermoelectric conversion material and an n-type thermoelectric conversion material, and joining the materials are crucial tasks. It is essential that good junction properties are maintained between the electrode material and the thermoelectric conversion materials, and the properties of the thermoelectric conversion materials do not deteriorate due to the electrode material. To realize this, consistency in thermal expansion coefficient among the thermoelectric conversion materials, the electrode material and the material used for joining them, and stability of the joining layers at the joint interfaces over an operating temperature range up to 600° C. are essential. If the difference in thermal expansion coefficient is large, a large thermal stress is generated there, disadvantageously causing breaking at the joining portions. Also, if element diffusion progresses at the joint interfaces between the electrode material and the thermoelectric conversion materials, the thermoelectric properties deteriorate, and the performance of the electrode material becomes poorer.

To address the above problems, it is disclosed in Patent Document 3 that a layer of titanium or a titanium alloy is provided between thermoelectric conversion materials and an electrode material at a high-temperature portion of the thermoelectric conversion material of a skutterudite structure.

[Patent Document 1] Japanese Laid-Open Patent Publication No. 2000-252526

[Patent Document 2] Japanese Laid-Open Patent Publication No. 2001-135865

[Patent Document 3] Japanese Laid-Open Patent Publication No. 2003-309294

When the inventors conducted an additional test using a filled skutterudite thermoelectric conversion material and Ti as a joining material, however, the electrode material separated from the filled skutterudite thermoelectric conversion material. One of the causes of the separation is considered to be due to the fact that the difference between the thermal expansion coefficient of the thermoelectric conversion material and the thermal expansion coefficient of the electrode material became larger with an increase in temperature, particularly at temperatures of 400° C. or higher, and a thermal stress was generated.

DISCLOSURE OF THE INVENTION

In view of the above circumstances, the present invention provides a thermoelectric conversion material having excellent thermoelectric performance even over a wide temperature range, and a thermoelectric conversion module that uses a joining member to provide an excellent junction between the thermoelectric conversion material and an electrode.

According to the present invention, there is provided an R-T-M-X-N thermoelectric conversion material that has a structure expressed by the following formula:
$R_rT_{t-m}M_mX_{x-n}N_n$ (C<r≤1, 3≤t−m≤5, 0≤m≤0.5, 10≤x≤15, 0≤n≤2), where R represents three or more elements selected from the group consisting of rare earth elements, alkali metal elements, alkaline-earth metal elements, group 4 elements, and group 13 elements, T represents at least one element selected from Fe and Co, M represents at least one element selected from the group consisting of Ru, Os, Rh, Ir, Ni, Pd, Pt, Cu, Ag, and Au, X represents at least one element selected from the group consisting of P, As, Sb, and Bi, and N represents at least one element selected from Se and Te.

In the present invention, to improve the thermoelectric performance of a skutterudite thermoelectric conversion material expressed by the chemical formula: $RT_4X_{12}$ (R being a metal, T being a transition metal, X being pnictogen), particularly, to improve the thermoelectric performance of a Sb-based skutterudite thermoelectric conversion material, at least one element selected from Fe and Co at the T site, three or more elements selected from the group consisting of rare earth elements, alkali metal elements, alkaline-earth metal elements, group 4 elements, group 13 elements at the R site, and at least one element selected from Sb, Se, and Te at the X site coexist in the crystal lattice of the thermoelectric conversion material. Accordingly, strong phonon scattering can be caused, especially by virtue of the coexistence of the three or more elements at the R site. Since the phonon scattering lowers the thermal conductivity κ, the value of the dimensionless figure of merit ZT can be made larger according to the formula (2).

Further, in the present invention, the value of the electrical power factor P (=$S^2/\rho$) of a thermoelectric conversion material having a skutterudite structure as a main phase can be made larger by adjusting the amounts of r, t, m, x, and n in $R_rT_{t-m}M_mX_{x-n}N_n$ (0<r≤1, 3≤t−m≤5, 0≤m≤0.5, 10≤x≤15, 0≤n≤2). By virtue of this effect, the value of the dimensionless figure of merit ZT can be made even larger.

According to the present invention, there is also provided an R-T-M-X-N thermoelectric conversion material in which m in the above formula $R_rT_{t-m}M_mX_{x-n}N_n$ is larger than 0. At least part of an element Fe or an element Co is substituted by at least one element selected from the group consisting of elements Ru, Os, Rh, Ir, Ni, Pd, Pt, Cu, Ag, and Au, so that the thermal conductivity κ can be made even lower. As a result, the value of the dimensionless figure of merit ZT indicating the thermoelectric performance of the thermoelectric conversion material can be made even larger.

According to the present invention, there is also provided an R-T-M-X-N thermoelectric conversion material in which n in the above formula $R_rT_{t-m}M_mX_{x-n}N_n$ is larger than 0. At least part of elements P and As or an element Sb is substituted by at least one element selected from the group consisting of elements Se and Te, so that the value of the electrical power factor P (=$S^2/\rho$) can be made larger, and the thermal conductivity κ can be made even lower. As a result, the value of the dimensionless figure of merit ZT indicating the thermoelectric performance of the thermoelectric conversion material can be made even larger.

According to the present invention, there is also provided a thermoelectric conversion module that includes:

at least one R-T-M-X-N thermoelectric conversion material that has a structure expressed by the following formula: $R_rT_{t-m}M_mX_{x-n}N_n$ (0<r≤1, 3≤t−m≤5, 0≤m≤0.5, 10≤x≤15, 0≤n≤2), where R represents three or more elements selected from the group consisting of rare earth elements, alkali metal elements, alkaline-earth metal elements, group 4 elements, and group 13 elements, T represents at least one element selected from Fe and Co, M represents at least one element selected from the group consisting of Ru, Os, Rh, Ir, Ni, Pd, Pt, Cu, Ag, and Au, X represents at least one element selected from the group consisting of P, As, Sb, and Bi, and N represents at least one element selected from Se and Te; and an electrode, a joining member being provided between the thermoelectric conversion material and the electrode, the joining member being a joining layer including an alloy layer made of at least one alloy selected from the group consisting of titanium alloys, nickel alloys, cobalt alloys, and iron alloys.

In other words, according to the present invention, there is provided a thermoelectric conversion module that includes a p-type thermoelectric conversion material and an n-type thermoelectric conversion material each having a filled skutterudite structure, or more particularly, Sb-based thermoelectric conversion materials, and electrodes. A joining layer having an alloy layer made of at least one alloy selected from the group consisting of titanium alloys, nickel alloys, cobalt alloys, and iron alloys is provided as a joining member between the p-type thermoelectric conversion material or the n-type thermoelectric conversion material and the electrode.

According to the present invention, in a thermoelectric conversion module using a Sb-based thermoelectric conversion material having a filled skutterudite structure, excellent junctions can be stably achieved over a wide temperature range by using a titanium alloy layer and an iron-group alloy layer containing as main component an iron-group element such as nickel, cobalt, or an iron as the joining member between the thermoelectric conversion material and the electrode. Furthermore, since the joining member contains titanium, diffusion of the constituents of the thermoelectric conversion material and the electrode can be effectively prevented.

According to the present invention, a thermoelectric conversion material having excellent thermoelectric performance over a wide temperature range is realized. Also, according to the present invention, a thermoelectric conversion module that has excellent thermoelectric performance over a wide temperature range and has an excellent junction between the thermoelectric conversion material and an electrode is realized.

BRIEF DESCRIPTION OF THE DRAWINGS

The above and other objects, features and advantages of the present invention will be more apparent from the following description of preferred embodiments taken in conjunction with the accompanying drawings.

BEST MODE FOR CARRYING OUT THE INVENTION

Figure 1:
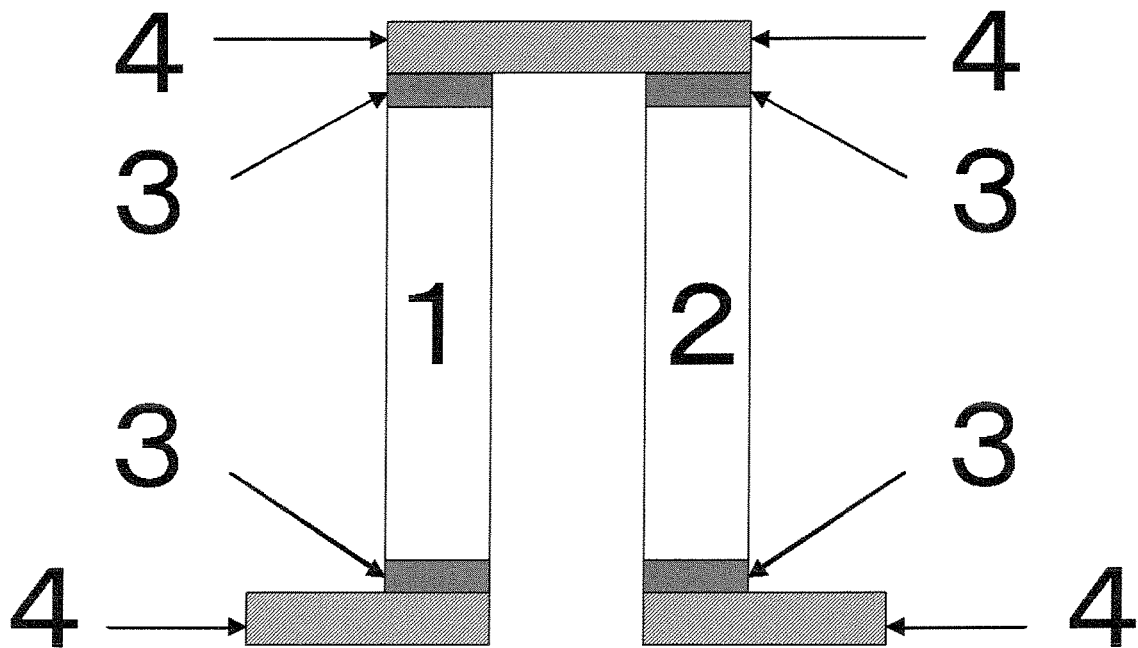
FIG. 1 is a diagram showing the structure of a p/n element pair of a thermoelectric conversion module.

A certain preferred embodiment of thermoelectric conversion materials and thermoelectric conversion modules according to the present invention will now be described in detail with reference to the accompanying drawings. In the drawings, like components are denoted by like reference numerals, and the same explanation will not be repeated.

A thermoelectric conversion material according to this embodiment is an R-T-M-X-N thermoelectric conversion material that has a structure expressed by the following formula: $R_r T_{t-m} M_m X_{x-n} N_n$ ($0 < r \leq 1$, $3 \leq t-m \leq 5$, $0 \leq m \leq 0.5$, $10 \leq x \leq 15$, $0 \leq n \leq 2$), where R represents three or more elements selected from the group consisting of rare earth elements, alkali metal elements, alkaline-earth metal elements, group 4 elements, and group 13 elements, T represents at least one element selected from Fe and Co, M represents at least one element selected from the group consisting of Ru, Os, Rh, Ir, Ni, Pd, Pt, Cu, Ag, and Au, X represents at least one element selected from the group consisting of P, As, Sb, and Bi, and N represents at least one element selected from Se and Te.

Examples of rare earth elements include Sc, Y, La, Ce, Pr, Nd, Sm, Eu, Gd, Tb, Dy, Ho, Er, Tm, Yb, and Lu.

Examples of alkali metal elements include Li, Na, K, Rb, Cs, and Fr.

Examples of alkaline-earth metal elements include Ca, Sr, and Ba.

Examples of group 4 elements include Ti, Zr, and Hf.

Examples of group 13 elements include B, Al, Ga, In, and Tl.

R represents three or more elements selected from the group consisting of rare earth elements, alkali metal elements, alkaline-earth metal elements, group 4 elements, and group 13 elements, and may be elements selected from different groups or may be elements selected from the same group. Examples of R in p-type thermoelectric conversion materials include a combination of three or more elements mainly selected from rare earth elements La and Ce, group 4 elements Ti, Zr, and Hf, and group 13 elements Al, Ga, and In. Examples of R in n-type thermoelectric conversion materials include a combination of three or more elements mainly selected from a rare earth element Yb, alkaline-earth metal elements Ca, Sr, and Ba, and group 13 elements Al, Ga, and In.

A thermoelectric conversion material according to this embodiment is not particularly limited, as long as it has a structure that satisfies the formula of the present invention. However, a thermoelectric conversion material according to this embodiment preferably has a filled skutterudite structure represented by the chemical formula $RT_4X_{12}$ (R being a metal, T being a transition metal, X being pnictogen). A thermoelectric conversion material having such a structure can be produced by a combination of a melting technique, a rapid solidification technique (gas atomization, water atomization, centrifugal atomization, a single-roll process, or a twin-roll process), a mechanical alloying technique (a ball mill technique), or a single-crystal growth technique, and a hot press technique, a heat sintering technique, a spark plasma sintering technique, or a heat treatment technique. However, the manufacture method is not limited to the above, as long as a filled skutterudite structure can be obtained.

Next, specific examples (i) to (iii) of methods for synthesizing a thermoelectric conversion material according to this embodiment will be described below.

(i) An example of a combination of a melting technique and a heat treatment technique is described as a method for synthesizing a thermoelectric conversion material according to this embodiment. Pure metal materials in predetermined proportions are put into a carbon crucible, and are heated to 1200° C. and melted by heating in an inert gas atmosphere with an electric furnace. After being maintained for 5 hours, they are maintained at 900° C. for 6 hours, 800° C. for 12 hours, 700° C. for 24 hours, and further 600° C. for 12 hours. After that, the materials are cooled to room temperature. In this manner, a desired thermoelectric conversion material can be obtained.

(ii) An example of a combination of a melting technique and a spark plasma sintering technique is described as a method for synthesizing a thermoelectric conversion material according to this embodiment. Pure metal materials in predetermined proportions are put into a carbon crucible, and they are heated to 1200° C. and melted by heating in an inert gas atmosphere. After being maintained for 5 hours, they are rapidly cooled into water. The water quenched materials are heated to 700° C. After being maintained for 24 hours, they are cooled to room temperature to obtain a desired ingot. The ingot material is pulverized, and the obtained powders are put into a carbon die. The powders are then heated to a temperature of 500 to 750° C. in vacuum or in an inert gas atmosphere while being subjected to a pulse current under a pressure of 60 MPa. After being maintained for 10 minutes, they are cooled to room temperature. In this manner, a desired thermoelectric conversion material can be obtained.

(iii) An example of a combination of a mechanical alloying technique and a spark plasma sintering technique is described as a method for synthesizing a thermoelectric conversion material according to this embodiment. First, pure metal powders in predetermined proportions are put into an alumina container in an inert gas atmosphere, and are mixed with alumina balls. Mechanical alloying is then performed for 24 hours to obtain raw powders. The powders are put into a carbon die, and are heated to a temperature of 500 to 750° C. in vacuum or in an inert gas atmosphere while being subjected to a pulse current under a pressure of 60 MPa. After being maintained for 10 minutes, the sintered materials are cooled to room temperature. In this manner, a desired thermoelectric conversion material can be obtained.

In any of the cases where one of the above synthesis methods (i) to (iii) was used, powder X-ray diffraction confirmed that the obtained thermoelectric conversion material had a filled skutterudite structure. Further, the relationships among the Seebeck coefficient S, the electric resistivity $\rho$, the thermal conductivity $\kappa$, and temperature T were measured, and the temperature dependence of the dimensionless figure of merit ZT was examined. As a result, the dimensionless figure of merit ZT became larger with an increase in temperature, and reached 1.0 to 1.3 at temperatures ranging from room temperature to 600° C.

Next, referring to FIG. 1, a thermoelectric conversion module according to this embodiment is described. FIG. 1 is a schematic diagram of the structure of the pair of p/n elements of the thermoelectric conversion module according to this embodiment.

As shown in FIG. 1, the thermoelectric conversion module of this embodiment includes joining members 3 between a p-type thermoelectric conversion material 1 and electrodes 4, and between an n-type thermoelectric conversion material 2 and the electrodes 4.

In this embodiment, the p-type thermoelectric conversion material 1 or the n-type thermoelectric conversion material 2 is a compound that has a filled skutterudite structure.

Further, the p-type thermoelectric conversion material 1 or the n-type thermoelectric conversion material 2 has a structure expressed by the following formula: $R_r T_{t-m} M_m X_{x-n} N_n$ ($0 < r \leq 1$, $3 \leq t-m \leq 5$, $0 \leq m \leq 0.5$, $10 \leq x \leq 15$, $0 \leq n \leq 2$), where, R represents three or more elements selected from the group consisting of rare earth elements, alkali metal elements, alkaline-earth metal elements, group 4 elements, and group 13 elements, T represents at least one element selected from Fe and Co, M represents at least one element selected from the group consisting of Ru, Os, Rh, Ir, Ni, Pd, Pt, Cu, Ag, and Au, X represents at least one element selected from the group consisting of P, As, Sb, and Bi, and N represents at least one element selected from Se and Te.

Such a filled skutterudite thermoelectric conversion material, particularly, a Sb-based filled skutterudite thermoelectric conversion material, typically has a thermal expansion coefficient that is equal to or greater than $8 \times 10^{-6}$ (/K) and equal to or smaller than $15 \times 10^{-6}$ (/K) at 20 to 600° C.

The joining members 3 function as joining members that join the p-type thermoelectric conversion material 1 and the electrodes 4, as well as the n-type thermoelectric conversion material 2 and the electrodes 4.

The joining members 3 are joining layers that include alloy layers made of at least one kind of alloy selected from the group consisting of titanium alloys, nickel alloys, cobalt alloys, and iron alloys. Further, the joining members 3 may be formed with one kind of alloy layers, but may also be formed with two or more kinds of alloy layers.

Examples of the materials of the alloy layers of the joining members 3 include a Ti alloy that has titanium as a main component and contains at least one of Al, Ga, In, and Sn, a Ni—Ti alloy that has nickel as a main component and contains titanium, a Co—Ti alloy that has cobalt as a main component and contains titanium, and a Fe—Ti alloy that has iron as a main component and contains titanium.

The composition ratio in the alloy layers of the joining members 3 is adjusted to match the thermal expansion coefficient of the thermoelectric conversion material. The alloy layers of the joining members 3 may be alloy layers made of a titanium alloy. The alloy layers of the joining members 3 made of a titanium alloy contain 50 wt % or more and less than 100 wt % of Ti, and more than 0 wt % and 50 wt % or less of at least one of Al, Ga, In, and Sn, based on the entire titanium alloy layers. Since the joining members 3 contain Ti, diffusion of the constituents contained in the p-type thermoelectric conversion material 1, the n-type thermoelectric conversion material 2, and the electrodes 4 can be restrained.

Alternatively, the alloy layers of the joining members 3 may be alloy layers made of a nickel alloy. The alloy layers of the joining members 3 made of a nickel alloy contain 50 wt % or more and less than 100 wt % of Ni, and more than 0 wt % and 50 wt % or less of Ti based on the entire nickel alloy layers. By virtue of Ni, the difference between the thermal expansion coefficient of the alloy layers of the joining members 3 and the thermal expansion coefficient of the p-type thermoelectric conversion material can be made smaller. Since the joining members 3 also contain Ti in this case, diffusion of the constituents contained in the p-type thermoelectric conversion material 1, the n-type thermoelectric conversion material 2, and the electrodes 4 can be restrained.

Alternatively, the alloy layers of the joining members 3 may be alloy layers made of an iron alloy. The alloy layers of the joining members 3 made of an iron alloy contain 50 wt % or more and less than 100 wt % of Fe, and more than 0 wt % and 50 wt % or less of Ti based on the entire iron alloy layers. By virtue of Fe, the difference between the thermal expansion coefficient of the joining members 3 and the thermal expansion coefficient of the p-type thermoelectric conversion material can be made smaller. Since the joining members 3 also contain Ti in this case, diffusion of the constituents contained in the p-type thermoelectric conversion material 1, the n-type thermoelectric conversion material 2, and the electrodes 4 can be restrained.

Alternatively, the alloy layers of the joining members 3 may be alloy layers made of a cobalt alloy. The alloy layers of the joining members 3 made of a cobalt alloy contain 50 wt % or more and less than 100 wt % of Co, and more than 0 wt % and 50 wt % or less of Ti based on the entire cobalt alloy layers. By virtue of Co, the difference between the thermal expansion coefficient of the alloy layers of the joining members 3 and the thermal expansion coefficient of the p-type thermoelectric conversion material can be made smaller. Since the joining members 3 also contain Ti in this case, diffusion of the constituents contained in the p-type thermoelectric conversion material 1, the n-type thermoelectric conversion material 2, and the electrodes 4 can be restrained.

The alloy layers of the joining members 3 preferably have a thermal expansion coefficient that is equal to or greater than $8 \times 10^{-6}$ (/K) and equal to or smaller than $15 \times 10^{-6}$ (/K) at 20 to 600° C. Accordingly, good junction properties can be achieved for the p-type thermoelectric conversion material 1, the n-type thermoelectric conversion material 2, and the electrodes 4.

Also, the difference in thermal expansion coefficient at 20 to 600° C. between the p-type and n-type thermoelectric conversion materials 1 and 2 and the alloy layers of the joining members is preferably equal to or more than 0% and equal to or less than 20% with respect to the values of the thermoelectric conversion materials. As the difference in thermal expansion coefficient is not larger than 20%, even better junction properties can be achieved for the p-type thermoelectric conversion material 1, the n-type thermoelectric conversion material 2, and the electrodes 4.

In this embodiment, "the difference in thermal expansion coefficient" means that the difference between "the thermal expansion coefficient of either the p-type thermoelectric conversion material 1 or the n-type thermoelectric conversion material 2 and the thermal expansion coefficient of the alloy layers of the joining members 3" with respect to the thermal expansion coefficient of "either the p-type thermoelectric conversion material 1 or the n-type thermoelectric conversion material 2" is equal to or more than 0% and equal to or less than 20%.

The alloy layers of the joining members 3 can be produced by a known technique such as sputtering, vapor deposition, thermal spraying, or SPS (Spark Plasma Sintering).

The present invention has been made based on the findings indicating that excellent adhesion properties are exhibited between a Sb-based p-type and n-type thermoelectric conversion material having a filled skutterudite structure and a titanium alloy, a nickel alloy, a cobalt alloy, or an iron alloy. The alloy layers of the joining members 3 produce a stable compound with good adhesion properties between each of the electrodes 4 and the p-type and n-type thermoelectric conversion materials 1 and 2, and prevent elemental diffusion between each of the electrodes 4 and the p-type and n-type thermoelectric conversion materials 1 and 2. The alloy layers of the joining members 3 can also reduce thermal stress, since the value of their thermal expansion coefficient is close to the value of the thermal expansion coefficient of the p-type thermoelectric conversion material 1, the n-type thermoelectric conversion material 2, and the material of the electrodes 4. In this embodiment, by using an alloy selected from the group consisting of predetermined titanium alloys, nickel alloys, cobalt alloys, and iron alloys to appropriately match with the variation in the thermal expansion coefficient of the Sb-based p-type thermoelectric conversion material 1 and the n-type thermoelectric conversion material 2 each having a filled skutterudite structure, good junction properties can be achieved.

The electrodes 4 are connected to each of the p-type thermoelectric conversion material 1 and the n-type thermoelectric conversion material 2 via the joining members 3.

The material of the electrodes 4 preferably contains an alloy selected from the group consisting of titanium alloys, nickel alloys, cobalt alloys, and iron alloys. Also, an alloy having the same composition as the alloy layers of the joining members 3 is preferably used for the material of the electrodes 4. With these materials, the adhesion properties between the two can be improved.

Alternatively, the material used as the material of the electrodes 4 may be a metal or an alloy having a thermal expansion coefficient that is equal to or greater than $8 \times 10^{-6}$ (/K) and equal to or smaller than $15 \times 10^{-6}$ (/K) at 20 to 600° C.

Here, the metal or the alloy is, for example, at least one element selected from the group consisting of iron, cobalt, nickel, chromium, copper, titanium, palladium, aluminum, tin, and niobium. For example, it is possible to use alloy steel such as SUS403 or SUS430 having a thermal expansion coefficient that is equal to or greater than $8 \times 10^{-6}$ (/K) and equal to or smaller than $15 \times 10^{-6}$ (/K) at 20 to 600° C. These materials can be joined by a known technique such as sputtering, vapor deposition, thermal spraying, SPS (Spark Plasma Sintering), or fine laser welding.

According to the above structure, a thermoelectric conversion module in which the p-type thermoelectric conversion material 1 and the n-type thermoelectric conversion material 2 each having a filled skutterudite structure are joined to the electrodes 4 in a stable manner can be provided. The thermoelectric conversion efficiency of the thermoelectric conversion module of this embodiment can reach 7% or higher at temperatures ranging from room temperature to 600° C.

It should be noted that the present invention is not limited to the above-described embodiment, and changes, modifications, and the like designed to achieve the object of the present invention should be considered to be within the scope of the invention.

EXAMPLES

Thermoelectric conversion materials and thermoelectric conversion modules according to the present invention will be described below by way of examples. Thermoelectric conversion materials and thermoelectric conversion modules according to the present invention are not limited to the following descriptions, and various changes and modifications may be made to them without departing from the scope of the invention.

[Thermoelectric Conversion Materials]
(Evaluation of Thermoelectric Properties)
Thermoelectric conversion materials were evaluated as follows.

With the use of thermoelectric property evaluation instruments (thermoelectric property evaluation system ZEM-2 and laser flash method thermal constant measuring system TC-7000H, manufactured by ULVAC-RIKO, Inc.), the Seebeck coefficient S, the electric resistivity $\rho$, and the thermal conductivity $\kappa$ of each thermoelectric conversion material were measured at temperatures ranging from room temperature to 600° C., and the dimensionless figure of merit ZT and the electrical power factor P ($P=S^2/\rho$) were calculated.

Examples 1 to 4

In Examples 1 to 4, the following p-type thermoelectric conversion materials were used.
Example 1 p-type $La_{0.7}Ba_{0.07}Ga_{0.1}Co_1Fe_3Sb_{12}$
Example 2 p-type $La_{0.7}Ba_{0.07}Ti_{0.1}Co_1Fe_3Sb_{12}$
Example 3 p-type $La_{0.7}Ba_{0.01}Ga_{0.1}Ti_{0.1}Co_1Fe_3Sb_{12}$
Example 4 p-type $La_{0.7}Ba_{0.01}Ga_{0.1}Ti_{0.1}Co_{1.2}Fe_{2.8}Sb_{12}$ The method for synthesizing the p-type thermoelectric conversion materials of Examples 1 to 4 is described below.

Pure metals La, Ba, Ga, Ti, Co, Fe, and Sb in predetermined proportions were put into a crucible made of carbon, and were heated to 1200° C. and melted by heating in an inert gas atmosphere with an electric furnace. After being maintained for 5 hours, they were water quenched. The water quenched materials were then heated to 700° C. After being maintained for 24 hours, they were cooled to room temperature to obtain a desired ingot. The ingot material was pulverized, and the obtained powders were put into a carbon die. They were heated to a temperature of 500 to 750° C. in vacuum or in an inert gas atmosphere while being subjected to a pulse current under a pressure of 60 MPa. After being maintained for 10 minutes, they were cooled to room temperature to obtain the desired thermoelectric conversion material.

Comparative Example 1

In this comparative example, a conventional $La_{0.7}Co_1Fe_3Sb_{12}$ thermoelectric conversion material was used.

The thermoelectric conversion material of Comparative Example 1 was synthesized as follows.

Pure metals La, Co, Fe, and Sb in predetermined proportions were put into a crucible made of carbon, and were heated to 1200° C. and melted by heating in an inert gas atmosphere with an electric furnace. After being maintained for 5 hours, they were water quenched. The water quenched materials were then heated to 700° C. After being maintained for 24 hours, they were cooled to room temperature to obtain a desired ingot. The ingot material was pulverized, and the obtained powders were put into a carbon die. They were heated to 600° C. in vacuum or in an inert gas atmosphere while being subjected to a pulse current under a pressure of 60 MPa. After being maintained for 10 minutes, they were cooled to room temperature to obtain the desired thermoelectric conversion materials.

With the use of the thermoelectric conversion materials synthesized according to Examples 1 to 4 and Comparative Example 1, the thermoelectric properties of each material were evaluated. FIGS. 2 to 6 show the results.

FIGS. 2 to 6 show the relationships among the Seebeck coefficients S, the electric resistivities $\rho$, the electrical power factors P, the thermal conductivities $\kappa$, and the dimensionless figures of merit ZT of the p-type thermoelectric conversion materials obtained in Examples 1 to 4.

Figure 6:
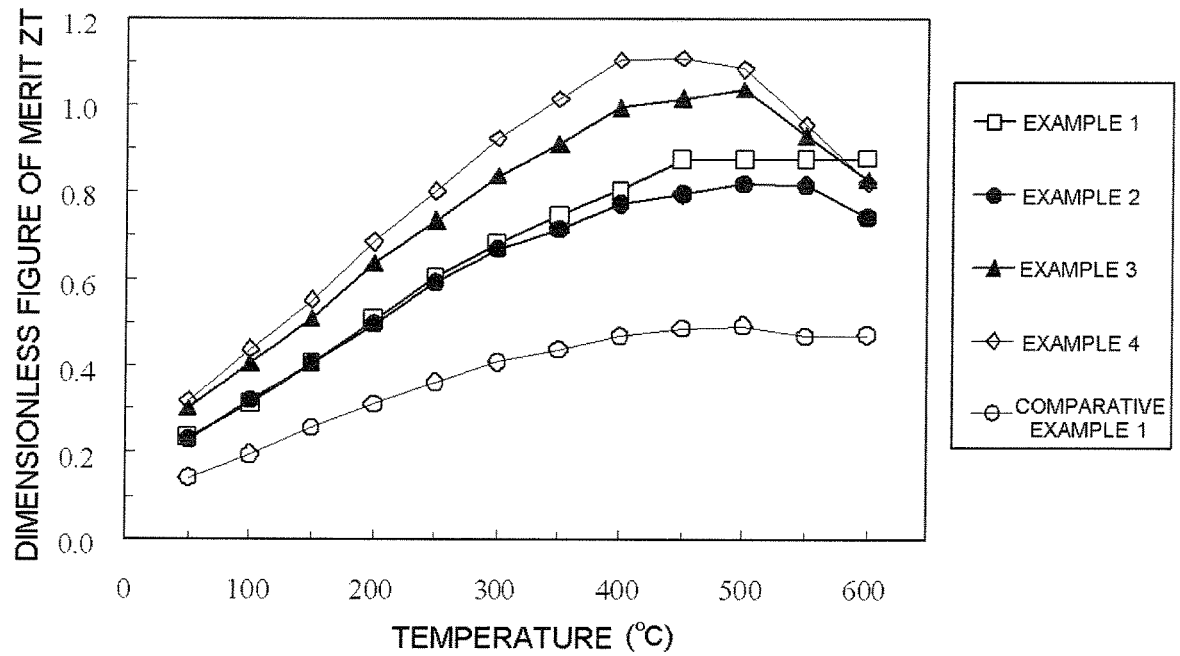
FIG. 6 is a graph showing the temperature dependence of the dimensionless figures of merit of the p-type thermoelectric conversion materials.
Figure 7:
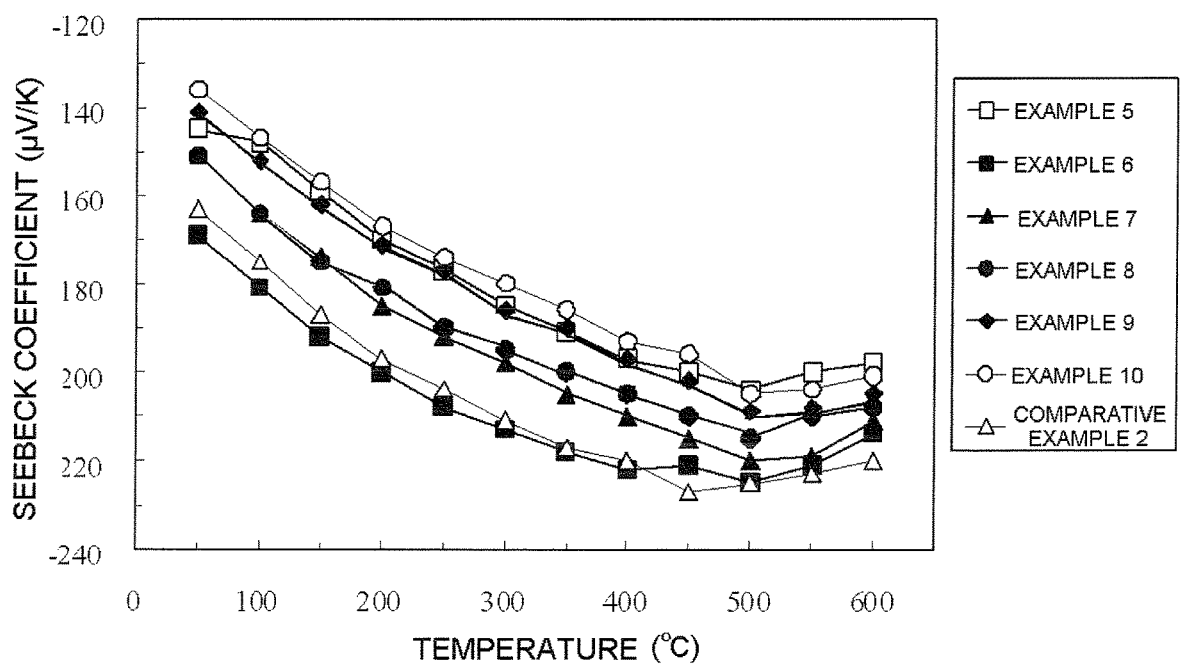
FIG. 7 is a graph showing the temperature dependence of the Seebeck coefficients of n-type thermoelectric conversion materials.
Figure 8:
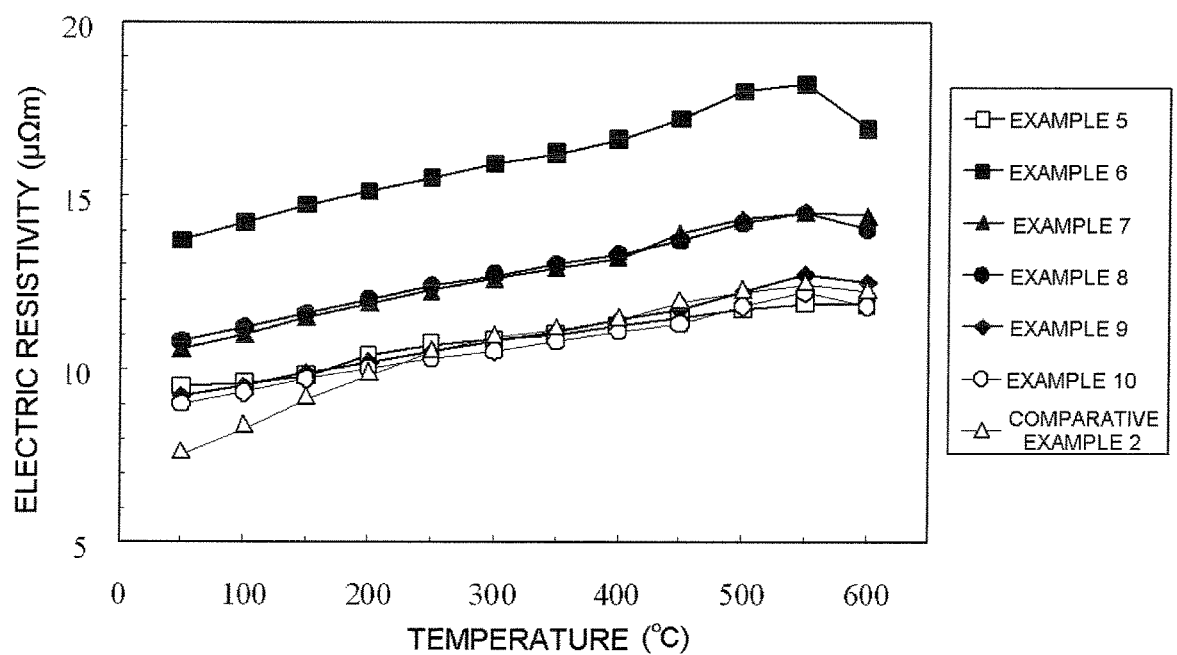
FIG. 8 is a graph showing the temperature dependence of the electric resistivities of the n-type thermoelectric conversion materials.
Figure 9:
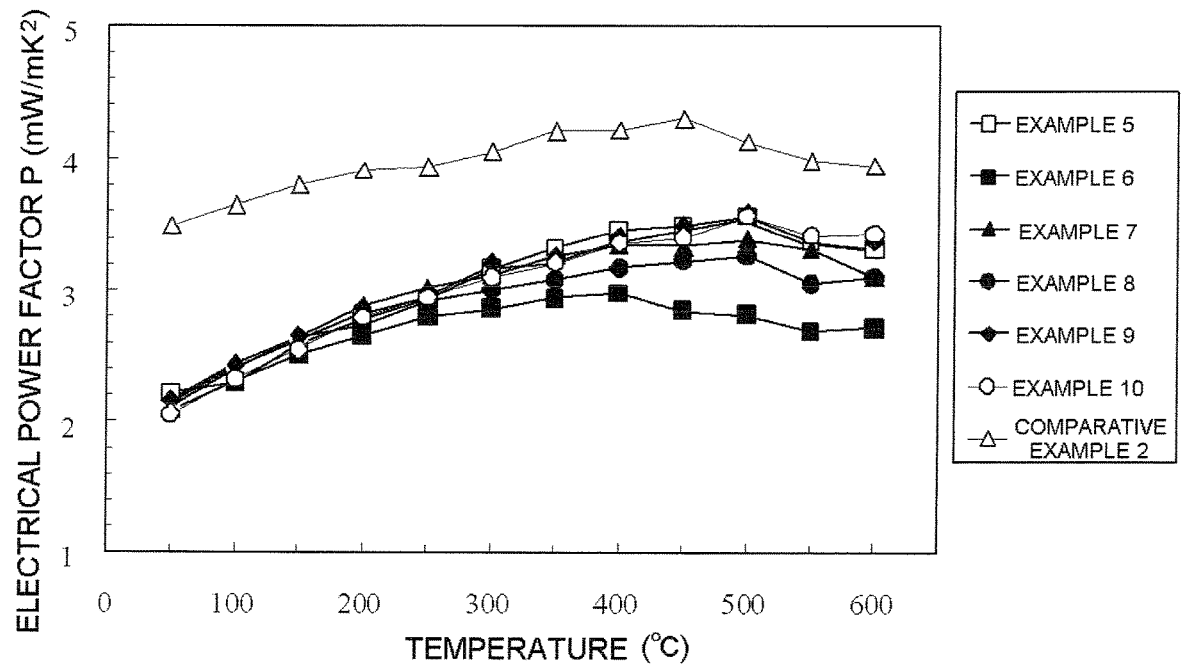
FIG. 9 is a graph showing the temperature dependence of the electrical power factors of the n-type thermoelectric conversion materials.
Figure 10:
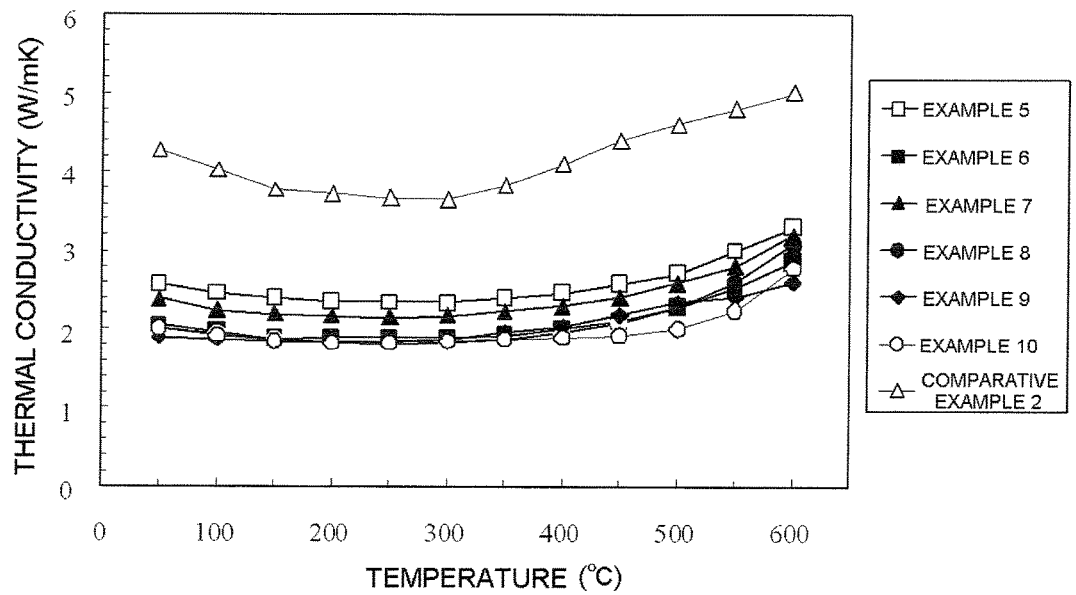
FIG. 10 is a graph showing the temperature dependence of the thermal conductivities of the n-type thermoelectric conversion materials.
Figure 11:
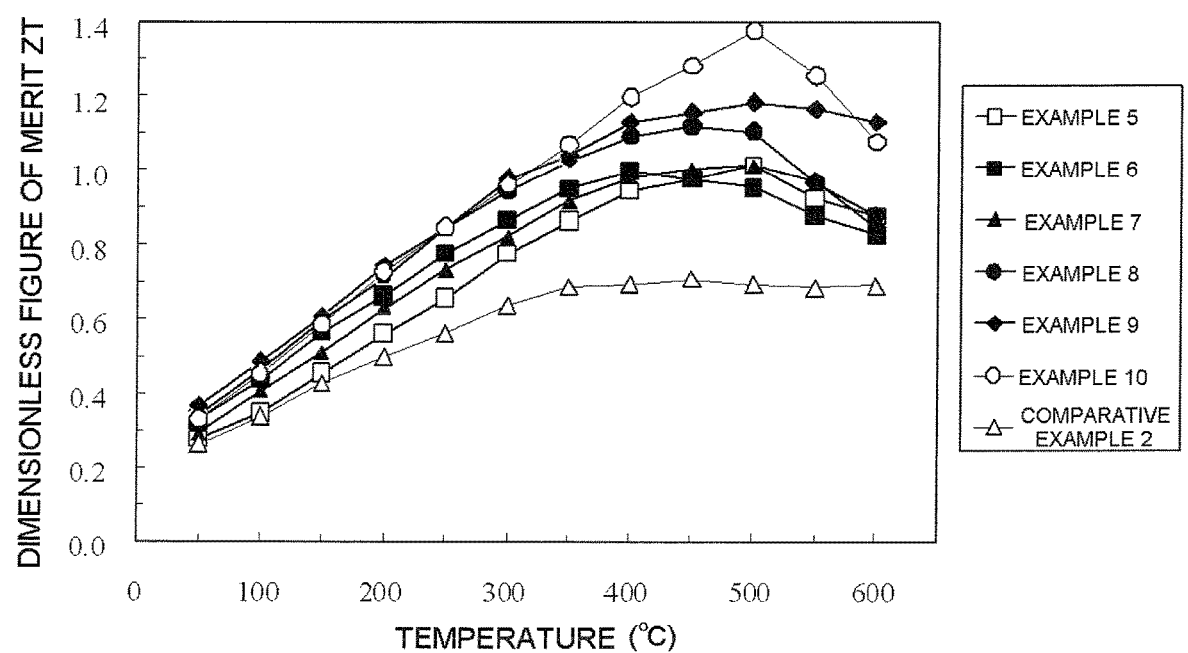
FIG. 11 is a graph showing the temperature dependence of the dimensionless figures of merit of the n-type thermoelectric conversion materials.

In Examples 1 to 4, the absolute values of the Seebeck coefficients S, the electric resistivities $\rho$, and the dimensionless figures of merit ZT became larger as the temperature became higher. As shown in FIG. 6, these results indicate that the dimensionless figures of merit ZT of the p-type thermoelectric conversion materials of Examples 1 to 4 became larger with the rise in temperature, and the maximum values of ZT exceeded 1 in Examples 3 and 4. Particularly, in the p-type thermoelectric conversion material $La_{0.7}Ba_{0.01}Ga_{0.1}Ti_{0.1}Co_{1.2}Fe_{2.8}Sb_{12}$ of Example 4, the value of the dimensionless figure of merit ZT was 0.7 at 200° C., 0.9 at 300° C., and 1.0 or greater at a temperature of 350 to 550° C., and reached 1.1, which is the maximum value of ZT, at 450° C.

In Comparative Example 1, on the other hand, the absolute value of the Seebeck coefficient S, the electric resistivity $\rho$, and the dimensionless figure of merit ZT became larger with a rise in temperature, but the maximum value of the dimensionless figure of merit ZT was 0.5 at 500° C.

Figure 2:
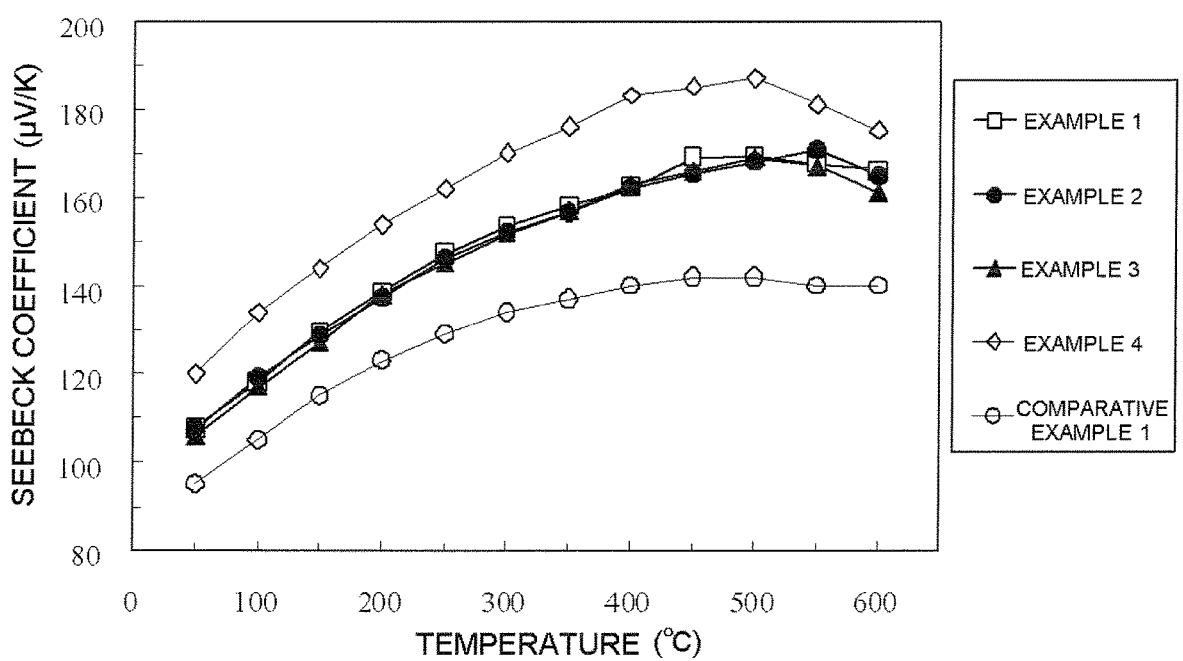
FIG. 2 is a graph showing the temperature dependence of the Seebeck coefficients of p-type thermoelectric conversion materials.
Figure 3:
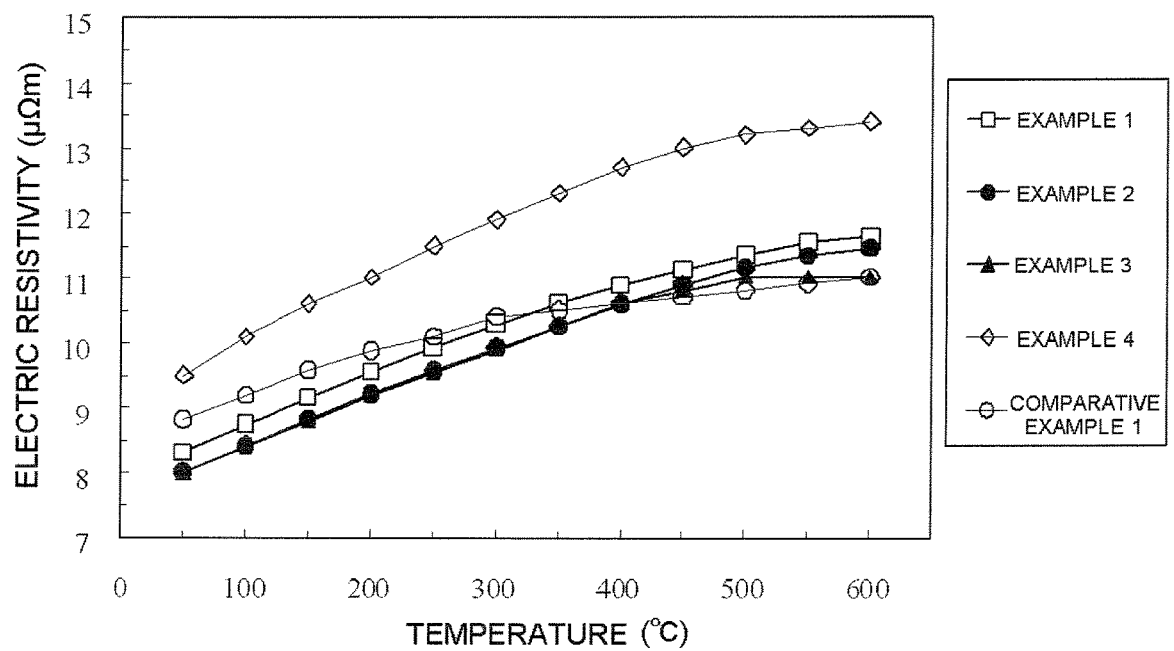
FIG. 3 is a graph showing the temperature dependence of the electric resistivities of the p-type thermoelectric conversion materials.
Figure 4:
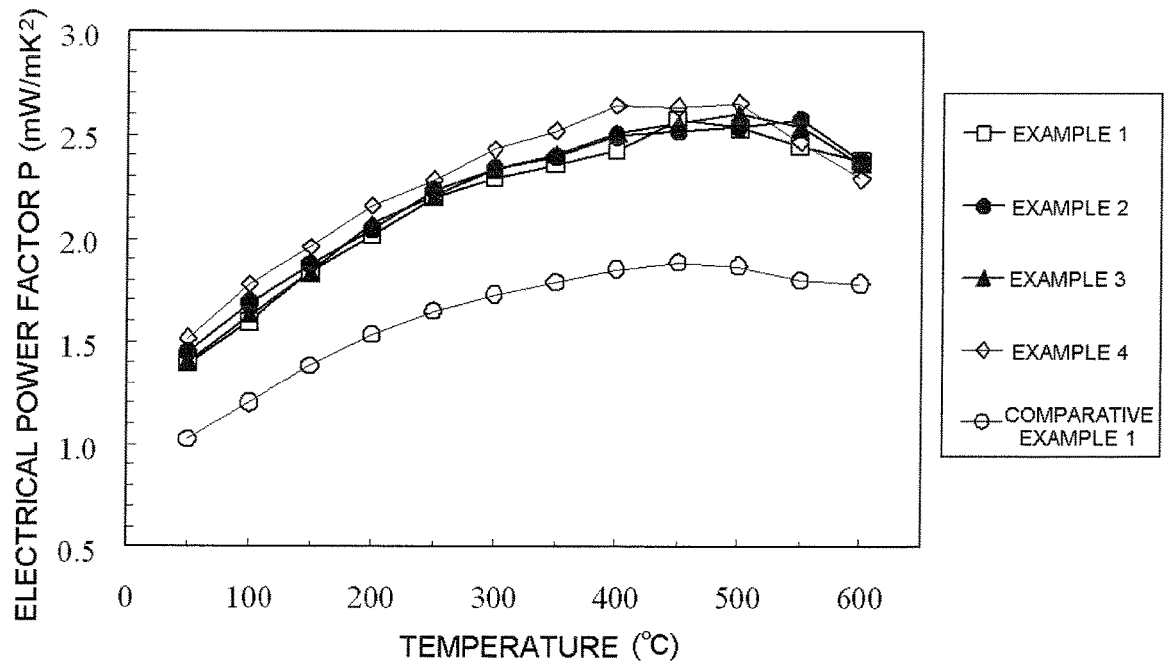
FIG. 4 is a graph showing the temperature dependence of the electrical power factors of the p-type thermoelectric conversion materials.
Figure 5:
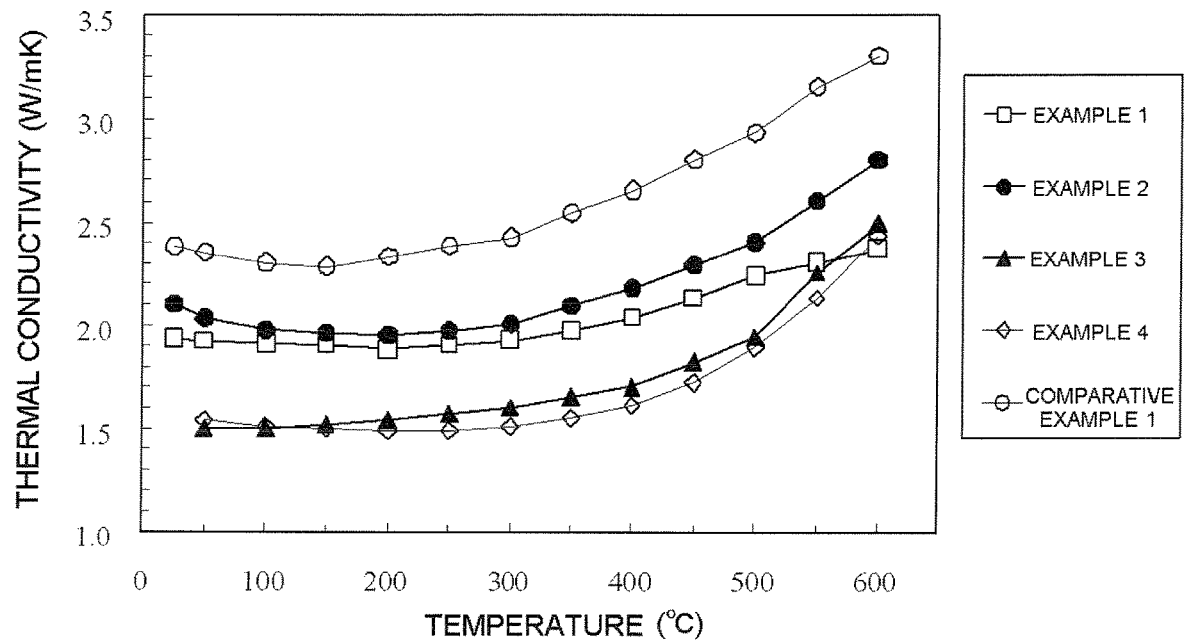
FIG. 5 is a graph showing the temperature dependence of the thermal conductivities of the p-type thermoelectric conversion materials.

Further, as shown in FIGS. 2 to 4, in the p-type thermoelectric conversion materials of Examples 1 to 4 at temperatures ranging from room temperature to 600° C., the Seebeck coefficients S were greater than that of the conventional p-type thermoelectric conversion material $La_{0.7}Co_1Fe_3Sb_{12}$ of Comparative Example 1, the electric resistivities were the same as or slightly greater than that of Comparative Example 1, and the electrical power factors P were much larger than that of Comparative Example 1. Meanwhile, as shown in FIG. 5, when three or more elements selected from the group consisting of a rare earth element La, an alkaline earth element Ba, a group 4 element Ti, and a group 13 element Ga were added at the same time, the thermal conductivities became as much as approximately 40% lower than that in Comparative Example 1 where only one element La was added. By virtue of the increases in electrical power factor P and the decreases in thermal conductivity, the dimensionless figures of merit ZT of the p-type thermoelectric conversion materials of Examples 1 to 4 of the present invention became much larger in the entire temperature range of room temperature to 600° C., as shown in FIG. 6. The maximum value reached 1.1, which was 1.2 times larger than 0.5 in Comparative Example 1. This proves that the arrangement of three or more kinds of elements to the R site suggested by the present invention is effective in improving the performance of thermoelectric conversion materials.

Examples 5 to 10

In Examples 5 to 10, the following n-type thermoelectric conversion materials were used.
Example 5 n-type $Yb_{0.3}Ca_{0.1}Al_{0.1}Co_{3.75}Fe_{0.25}Sb_{12}$
Example 6 n-type $Yb_{0.3}Ca_{0.1}Ga_{0.1}Co_{3.75}Fe_{0.25}Sb_{12}$
Example 7 n-type $Yb_{0.3}Ca_{0.1}In_{0.1}Co_{3.75}Fe_{0.25}Sb_{12}$
Example 8 n-type $Yb_{0.3}Ca_{0.1}Al_{0.1}Ga_{0.1}Co_{3.75}Fe_{0.25}Sb_{12}$
Example 9 n-type $Yb_{0.3}Ca_{0.1}Al_{0.1}Ga_{0.1}In_{0.1}Co_{3.75}Fe_{0.25}Sb_{12}$
Example 10 n-type $Yb_{0.3}Ca_{0.1}Al_{0.1}Ga_{0.1}In_{0.3}Co_{3.75}Fe_{0.25}Sb_{12}$ The method for synthesizing the n-type thermoelectric conversion materials of Examples 5 to 10 is described below.

Pure metals Yb, Ca, Al, Ga, In, Co, Fe, and Sb in predetermined proportions were put into a crucible made of carbon, and were heated to 1200° C. and melted by heating in an inert gas atmosphere with an electric furnace. After being maintained for 5 hours, they were maintained at 900° C. for 6 hours, 800° C. for 12 hours, 700° C. for 24 hours, and further, 600° C. for 12 hours. They were then cooled to room temperature to obtain a desired ingot. The ingot material was pulverized, and the obtained powders were put into a carbon die. They were heated to a temperature of 500 to 750° C. in vacuum or in an inert gas atmosphere while being subjected to a pulse current under a pressure of 60 MPa. After being maintained for 10 minutes, they were cooled to room temperature to obtain the desired thermoelectric conversion materials.

Comparative Example 2

In this comparative example, a conventional n-type $Yb_{0.15}Co_4Sb_{12}$ thermoelectric conversion material was used.

The thermoelectric conversion material of Comparative Example 2 was synthesized as follows.

Pure metals Yb, Co, and Sb in predetermined proportions were put into a crucible made of carbon, and were heated to 1200° C. and melted by heating in an inert gas atmosphere with an electric furnace. After being maintained for 5 hours, they were maintained at 900° C. for 6 hours, subsequently 800° C. for 12 hours, 700° C. for 24 hours, and further, 600° C. for 12 hours. They were then cooled to room temperature to obtain a desired ingot. The ingot material was pulverized, and the obtained powders were put into a carbon die. They were heated to 700° C. in vacuum or in an inert gas atmosphere while being subjected to a pulse current under a pressure of 60 MPa. After being maintained for 10 minutes, they were cooled to room temperature to obtain the desired thermoelectric conversion materials.

With the use of the thermoelectric conversion materials synthesized according to Examples 5 to 10 and Comparative Example 2, the thermoelectric properties of each material were evaluated. FIGS. 7 to 11 show the results.

FIGS. 7 to 11 show the relationships among the Seebeck coefficients S, the electric resistivities ρ, the electrical power factors P, the thermal conductivities κ, and the dimensionless figures of merit ZT of the n-type thermoelectric conversion materials obtained in Examples 5 to 10.

In Examples 5 to 10, the absolute values of the Seebeck coefficients S, the electric resistivities ρ, and the dimensionless figures of merit ZT became larger as the temperature became higher, and the maximum values of ZT reached 1.0 to 1.3. As can be seen from FIG. 11, in the n-type thermoelectric conversion material $Yb_{0.3}Ca_{0.1}Al_{0.1}Ga_{0.1}In_{0.3}Co_{3.75}Fe_{0.25}Sb_{12}$ of Example 10, the dimensionless figure of merit ZT was 0.8 at 200° C., was larger than 1 at temperatures ranging from 300 to 600° C., and was 1.3 at 550° C. It has become apparent that the value of the dimensionless figure of merit ZT of this n-type thermoelectric conversion material exceeds 1 at a wide range of temperatures of 300 to 600° C., and this n-type thermoelectric conversion material has excellent thermoelectric properties at temperatures ranging from room temperature to 600° C.

In Comparative Example 2, on the other hand, the dimensionless figure of merit ZT was 0.5 at 200° C., and was 0.6 at 300° C. The maximum value of the dimensionless figure of merit ZT was 0.7 at temperatures ranging from 400 to 600° C.

Comparisons among Examples 5 to 10 and Comparative Example 2 show that the addition of multiple elements Al, Ga, In, Yb, and Ca adversely affected the absolute value of the Seebeck coefficient and the electric resistivity of each material, and reduced the value of each electrical power factor P. On the other hand, the addition of the multiple elements greatly reduced the thermal conductivities of the thermoelectric conversion materials of Examples 5 to 10, and the values of the thermal conductivities became as small as half the thermal conductivity of the n-type thermoelectric conversion material $Yb_{0.15}Co_4Sb_{12}$ of Comparative Example 2. Accordingly, the dimensionless figures of merit ZT of the n-type thermoelectric conversion materials of Examples 5 to 10 increased from 0.7, which is the maximum value of Comparative Example 2, to 1.0 to 1.3. This proves that the simultaneous existence of three or more kinds of elements at the R site suggested by the present invention is effective particularly in improving the performance of thermoelectric conversion materials.

Examples 11 to 20

Table 1 shows the compositions of thermoelectric conversion materials of Examples 11 to 20, and the results of evaluations made on the thermoelectric properties of the respective thermoelectric conversion materials.

The above-described method for synthesizing the p-type thermoelectric conversion materials was used in Examples 11 to 15 and the above-described method for synthesizing the n-type thermoelectric conversion materials was used in Examples 16 to 20 to synthesize the thermoelectric conversion materials having the respective compositions, and the thermoelectric properties of the respective materials were evaluated.

TABLE 1

| Example | Composition | Maximum value of ZT |
|---------|-------------|---------------------|
| 3 | p-type $La_{0.7}Ba_{0.01}Ga_{0.1}Ti_{0.1}Co_1Fe_3Sb_{12}$ | 1.00 |
| 11 | p-type $La_{0.7}Ba_{0.01}Ga_{0.1}Ti_{0.1}Co_1Fe_{2.9}Ru_{0.1}Sb_{12}$ | 1.03 |
| 12 | p-type $La_{0.7}Ba_{0.01}Ga_{0.1}Ti_{0.1}Co_1Fe_{2.9}Rh_{0.1}Sb_{12}$ | 1.05 |
| 13 | p-type $La_{0.7}Ba_{0.01}Ga_{0.1}Ti_{0.1}Co_1Fe_{2.9}Pt_{0.1}Sb_{12}$ | 1.05 |
| 14 | p-type $La_{0.7}Ba_{0.01}Ga_{0.1}Ti_{0.1}Co_1Fe_3Sb_{11.5}Te_{0.5}$ | 1.04 |
| 15 | p-type $La_{0.7}Ba_{0.01}Ga_{0.1}Ti_{0.1}Co_1Fe_3Sb_{11.5}Se_{0.5}$ | 1.05 |
| 8 | n-type $Yb_{0.3}Ca_{0.1}Al_{0.1}Ga_{0.1}Co_{3.75}Fe_{0.25}Sb_{12}$ | 1.10 |
| 16 | n-type $Yb_{0.3}Ca_{0.1}Al_{0.1}Ga_{0.1}Co_{3.7}Fe_{0.2}Os_{0.1}Sb_{12}$ | 1.15 |
| 17 | n-type $Yb_{0.3}Ca_{0.1}Al_{0.1}Ga_{0.1}Co_{3.7}Fe_{0.2}Ir_{0.1}Sb_{12}$ | 1.14 |
| 18 | n-type $Yb_{0.3}Ca_{0.1}Al_{0.1}Ga_{0.1}Co_{3.7}Fe_{0.2}Pd_{0.1}Sb_{12}$ | 1.13 |
| 19 | n-type $Yb_{0.3}Ca_{0.1}Al_{0.1}Ga_{0.1}Co_{3.75}Fe_{0.25}Sb_{11.5}Te_{0.5}$ | 1.15 |
| 20 | n-type $Yb_{0.3}Ca_{0.1}Al_{0.1}Ga_{0.1}Co_{3.75}Fe_{0.25}Sb_{11.5}Se_{0.5}$ | 1.14 |

As a result of partially substituting Fe in the p-type $La_{0.7}Ba_{0.01}Ga_{0.1}Ti_{0.1}Co_1Fe_3Sb_{12}$ thermoelectric conversion material of Example 3 by Ru, Rh, and Pt, the thermal conductivities of the p-type thermoelectric conversion materials of Examples 11 to 13 became lower than the thermal conductivity of Example 3. Accordingly, the maximum value of the dimensionless figure of merit ZT indicating the thermoelectric characteristics became larger than 1.0, which was the maximum value of the dimensionless figure of merit ZT of Example 3, and reached 1.03 to 1.05. Further, as a result of partially substituting Sb by Te and Se, the electric resistivities of the p-type thermoelectric conversion materials of Examples 14 and 15 became lower than the electric resistivity of Example 3. Accordingly, the maximum value of the dimensionless figure of merit ZT indicating the thermoelectric characteristics became larger than 1.0, which was the maximum value of the dimensionless figure of merit ZT of Example 3, and reached 1.04 to 1.05.

As a result of partially substituting Fe in the n-type $Yb_{0.3}Ca_{0.1}Al_{0.1}Ga_{0.1}Co_{3.75}Fe_{0.25}Sb_{12}$ thermoelectric conversion material of Example 8 by Os, Ir, and Pd, the thermal conductivities of the n-type thermoelectric conversion materials of Examples 16 to 18 became lower than the thermal conductivity of Example 8. Accordingly, the maximum value of the dimensionless figure of merit ZT indicating the thermoelectric characteristics became larger than 1.1, which was the maximum value of the dimensionless figure of merit ZT of Example 8, and reached 1.13 to 1.15. Further, as a result of partially substituting Sb by Te and Se, the electric resistivities of the n-type thermoelectric conversion materials of Examples 19 and 20 became lower than the electric resistivity of Example 8. Accordingly, the maximum value of the dimensionless figure of merit ZT indicating the thermoelectric characteristics became larger than 1.1, which was the maximum value of the dimensionless figure of merit ZT of Example 8, and reached 1.14 to 1.15.

These results prove that the thermal conductivity κ can be further lowered and the value of the dimensionless figure of merit ZT can be made larger by substituting at least part of an element Fe or an element Co by at least one element selected from the group consisting of elements Ru, Os, Rh, Ir, Ni, Pd, Pt, Cu, Ag, and Au. Furthermore, these results prove that the value of the electrical power factor P can be made larger and the value of the dimensionless figure of merit ZT can be made even larger by substituting at least part of elements P and As or an element Sb by at least one element selected from the group consisting of elements Se and Te.

[Thermoelectric Conversion Module]

In the following, thermoelectric conversion modules according to the present invention will be specifically described by way of Examples.

Example 21

A p-type thermoelectric conversion material $La_{0.7}Ba_{0.01}Ga_{0.1}Ti_{0.1}Fe_3Co_1Sb_{12}$ (having a thermal expansion coefficient of approximately $13.5\times10^{-6}$ (/K) at 20 to 600° C.) and an n-type thermoelectric conversion material $Yb_{0.3}Ca_{0.1}Al_{0.1}Ga_{0.1}Fe_{0.25}Co_{3.75}Sb_{12}$ (having a thermal expansion coefficient of approximately $10.5\times10^{-6}$ (/K) at 20 to 600° C.) were both cut and processed into prismatic columns of 5 mm×5 mm×7 mm by a diamond cutter. Eighteen prismatic p-elements and eighteen prismatic n-elements were used, and the eighteen pairs of p/n elements were arranged in a 40-mm-square area. Using $Ni_3Ti$ (79 wt % of Ni, 21 wt % of Ti) having a thermal expansion coefficient of $12.2\times10^{-6}$ (/K) at 20 to 600° C. as the joining members and the electrode members, a thermal spraying operation was performed to electrically series-connect both ends of each p/n element, to produce eighteen pairs of 40-mm-square thermoelectric conversion modules.

A heat cycle test was conducted on the thermoelectric conversion modules manufactured by the above method. Specifically, a heat cycle test was conducted in an argon atmosphere, by using a block heater on the hot side, and performing air cooling by a fan and a heat sink on the cold side. The temperature of the hot side electrodes was increased from 200° C. to 600° C. in 30 minutes, and was maintained for 2 hours. Then, the temperature of the hot side electrodes was controlled to drop to 200° C. in 30 minutes. This cycle was repeated until the number of completed cycles reached 100 in total. As a result, there was no increase in internal resistance of the thermoelectric conversion modules measured in each cycle, and it became apparent that very good junctions were formed.

After the heat cycle test, the power generation performance of the thermoelectric conversion modules were measured under the condition that the temperature of the hot side was 600 and 700° C., and the temperature of the cold side was 50° C. As a result, the respective maximum power outputs were 16 W and 21 W, and the output densities were 1.0 $W/cm^2$ and 1.3 $W/cm^2$.

The above results indicate that the thermoelectric conversion modules manufactured with the use of the thermoelectric conversion materials and the method for manufacturing a thermoelectric conversion module according to the present invention have high durability and excellent power generation performance.

Example 22

A p-type thermoelectric conversion material $La_{0.7}Ba_{0.01}Ga_{0.1}Ti_{0.1}Fe_{2.8}Co_{1.2}Sb_{12}$ (having a thermal expansion coefficient of approximately $14.0\times10^{-6}$ (/K) at 20 to 600° C.) and an n-type thermoelectric conversion material $Yb_{0.3}Ca_{0.1}Al_{0.1}Ga_{0.1}In_{0.1}Fe_{0.25}Co_{3.75}Sb_{12}$ (having a thermal expansion coefficient of approximately $10.0\times10^{-6}$ (/K) at 20 to 600° C.) were both cut and processed into prismatic columns of 5 mm×5 mm×7 mm by a diamond cutter. Thirty-two prismatic p-elements and thirty-two prismatic n-elements were used, and the thirty-two pairs of p/n elements were arranged in a 50-mm-square area. Also, 95 wt % of Ni and 5 wt % of Ti having a thermal expansion coefficient of $13.0\times10^{-6}$ (/K) at 20 to 600° C. were used as the joining members of the p-type thermoelectric conversion material, and $Ti_3(Al, Sn)$ (80 wt % of Ti, 15 wt % of Al, 5 wt % of Sn) having a thermal expansion coefficient of $10.4\times10^{-6}$ (/K) at 20 to 600° C. was used as the alloy layers 1 of the joining members of the n-type thermoelectric material. Further, 85 wt % of Co and 15 wt % of Ti having a thermal expansion coefficient of $12.0\times10^{-6}$ (/K) at 20 to 600° C. were used as the alloy layers 2 of the joining members of the n-type thermoelectric material. The alloy layers 2 were joined onto the alloy layers 1 of the joining members of the n-type thermoelectric material. Also, SUS403 was used as the electrode material. A thermal spraying operation was performed to electrically series-connect both ends of each p/n element, to produce thirty-two pairs of 50-mm-square thermoelectric conversion modules.

A heat cycle test was conducted on the thermoelectric conversion modules manufactured by the above method. Specifically, a heat cycle test was conducted in an argon atmosphere, by using a block heater on the hot side, and performing air cooling by a fan and a heat sink on the cold side. The temperature of the hot side electrodes was increased from 200° C. to 600° C. in 30 minutes, and was maintained for 2 hours. Then, the temperature of the hot side electrodes was controlled to drop to 200° C. in 30 minutes. This cycle was repeated until the number of completed cycles reached 100 in total. As a result, there was no increase in internal resistance of the thermoelectric conversion modules measured in each cycle, and it became apparent that very good junctions were formed.

After the heat cycle test, the power generation performance of the thermoelectric conversion modules were measured under the condition that the temperature of the hot side was 600 and 700° C., and the temperature of the cold side was 50° C. As a result, the respective maximum power outputs were 25 W and 33 W, and the output densities were 1.0 W/cm$^2$ and 1.3 W/cm$^2$.

The above results indicate that the thermoelectric conversion modules manufactured with the use of the thermoelectric conversion materials and the method for manufacturing a thermoelectric conversion module according to the present invention have high durability and excellent power generation performance.

Example 23

A p-type thermoelectric conversion material $La_{0.7}Ba_{0.01}Ga_{0.1}Ti_{0.1}Fe_3Co_1Sb_{12}$ (having a thermal expansion coefficient of approximately $13.5\times10^{-6}$ (/K) at 20 to 600° C.) and an n-type thermoelectric conversion material $Yb_{0.3}Ca_{0.1}Al_{0.1}Ga_{0.1}In_{0.1}Fe_{0.25}Co_{3.75}Sb_{12}$ (having a thermal expansion coefficient of approximately $10.0\times10^{-6}$ (/K) at 20 to 600° C.) were both cut and processed into prismatic columns of 5 mm×5 mm×7 mm by a diamond cutter. Thirty-two prismatic p-elements and thirty-two prismatic n-elements were used, and the thirty-two pairs of p/n elements were arranged in a 50-mm-square area. Also, 95 wt % of Co and 5 wt % of Ti having a thermal expansion coefficient of $12.8\times10^{-6}$ (/K) at 20 to 600° C. were used as the alloy layers of joining members of the p-type thermoelectric conversion material, and $Ti_3(Al, Sn)$ (80 wt % of Ti, 15 wt % of Al, 5 wt % of Sn) having a thermal expansion coefficient of $10.4\times10^{-6}$ (/K) at 20 to 600° C. was used as the alloy layers 1 of the joining members of the n-type thermoelectric material. Further, 85 wt % of Co and 15 wt % of Ti having a thermal expansion coefficient of $12.0\times10^{-6}$ (/K) at 20 to 600° C. were used as the alloy layers 2 of the joining members of the n-type thermoelectric material. The alloy layers 2 were joined onto the alloy layers 1 of the joining members of the n-type thermoelectric material. Also, SUS403 was used as the electrode material. A thermal spraying operation was performed to electrically series-connect both ends of each p/n element, to produce thirty-two pairs of 50-mm-square thermoelectric conversion modules.

A heat cycle test was conducted on the thermoelectric conversion modules manufactured by the above method. Specifically, a heat cycle test was conducted in an argon atmosphere by using a block heater on the hot side, and performing air cooling by a fan and a heat sink on the cold side. The temperature of the hot side electrodes was increased from 200° C. to 600° C. in 30 minutes, and was maintained for 2 hours. Then, the temperature of the hot side electrodes was controlled to drop to 200° C. in 30 minutes. This cycle was repeated until the number of completed cycles reached 100 in total. As a result, there was no increase in internal resistance of the thermoelectric conversion modules measured in each cycle, and it became apparent that very good junctions were formed.

After the heat cycle test, the power generation performance of the thermoelectric conversion modules were measured under the condition that the temperature of the hot side was 600 and 700° C., and the temperature of the cold side was 50° C. As a result, the respective maximum power outputs were 25 W and 33 W, and the output densities were 1.0 W/cm$^2$ and 1.3 W/cm$^2$.

The above results indicate that the thermoelectric conversion modules manufactured with the use of the thermoelectric conversion materials and the method for manufacturing a thermoelectric conversion module according to the present invention have high durability and excellent power generation performance.

Example 24

A p-type thermoelectric conversion material $La_{0.7}Ba_{0.01}Ga_{0.1}Ti_{0.1}Fe_3Co_1Sb_{12}$ (having a thermal expansion coefficient of approximately $13.5\times10^{-6}$ (/K) at 20 to 600° C.) and an n-type thermoelectric conversion material $Yb_{0.3}Ca_{0.1}Al_{0.1}Ga_{0.1}In_{0.1}Fe_{0.25}Co_{3.75}Sb_{12}$ (having a thermal expansion coefficient of approximately $10.0\times10^{-6}$ (/K) at 20 to 600° C.) were both cut and processed into prismatic columns of 5 mm×5 mm×7 mm by a diamond cutter. Thirty-two prismatic p-elements and thirty-two prismatic n-elements were used, and the thirty-two pairs of p/n elements were arranged in a 50-mm-square area. Also, 95 wt % of Fe and 5 wt % of Ti having a thermal expansion coefficient of $12.5\times10^{-6}$ (/K) at 20 to 600° C. were used as the alloy layers of joining members of the p-type thermoelectric conversion material, and $Ti_3(Al, Sn)$ (80 wt % of Ti, 15 wt % of Al, 5 wt % of Sn) having a thermal expansion coefficient of $10.4\times10^{-6}$ (/K) at 20 to 600° C. was used as the alloy layers 1 of the joining members of the n-type thermoelectric material. Further, 85 wt % of Co and 15 wt % of Ti having a thermal expansion coefficient of $12.0\times10^{-6}$ (/K) at 20 to 600° C. were used as the alloy layers 2 of the joining members of the n-type thermoelectric material. The alloy layers 2 were joined onto the alloy layers 1 of the joining members of the n-type thermoelectric material. Also, SUS403 was used as the electrode material. A thermal spraying operation was performed to electrically series-connect both ends of the p/n elements, to produce thirty-two pairs of 50-mm-square thermoelectric conversion modules.

A heat cycle test was conducted on the thermoelectric conversion modules manufactured by the above method. Specifically, a heat cycle test was conducted in an argon atmosphere by using a block heater on the hot side, and performing air cooling by a fan and a heat sink on the cold side. The temperature of the hot side electrodes was increased from 200° C. to 600° C. in 30 minutes, and was maintained for 2 hours. Then, the temperature of the hot side electrodes was controlled to drop to 200° C. in 30 minutes. This cycle was repeated until the number of completed cycles reached 100 in total. As a result, there was no increase in internal resistance of the thermoelectric conversion modules measured in each cycle, and it became apparent that very good junctions were formed.

After the heat cycle test, the power generation performance of the thermoelectric conversion modules were measured under the condition that the temperature of the hot side was 600 and 700° C., and the temperature of the cold side was 50° C. As a result, the respective maximum power outputs were 25 W and 33 W, and the output densities were 1.0 W/cm$^2$ and 1.3 W/cm$^2$.

The above results indicate that the thermoelectric conversion modules manufactured with the use of the thermoelectric conversion materials and the method for manufacturing a thermoelectric conversion module according to the present invention have high durability and excellent power generation performance.

Comparative Example 3

In the process of manufacturing the thermoelectric conversion modules of Example 22, the joining members were replaced with those made of Ti, and modules were produced under the same conditions as those in Example 22. However, the electrode material could not be joined to the p/n thermoelectric conversion materials, and modules could not be formed.

Comparative Example 4

In the process of manufacturing the thermoelectric conversion modules of Example 23, the joining members were replaced with those made of Ti, and modules were produced under the same conditions as those in Example 23. However, the electrode material could not be joined to the p/n thermoelectric conversion materials, and modules could not be formed.

Comparative Examples 3 and 4 prove that the Ti layer disclosed in Patent Document 3 (Japanese Laid-Open Patent Publication No. 2003-309294) is not suitable for the thermoelectric conversion materials of the present invention.

This application claims the benefit of priority of Japanese Patent Application No. 2008-12213, filed on Jan. 23, 2008, and Japanese Patent Application No. 2008-64358, filed on Mar. 13, 2008, the entire disclosures of which are incorporated herein by reference.

The invention claimed is:

1. A thermoelectric conversion module comprising:
a thermoelectric conversion material;
an electrode; and
a joining member provided between the thermoelectric conversion material and the electrode,
wherein the thermoelectric conversion material has a structure expressed by the formula: $Ga_{0.1}R_{r-0.1}T_{t-m}M_m X_{x-n}N_n$ ($0.1 < r \leq 1$, $3 \leq t-m \leq 5$, $0 \leq m \leq 0.5$, $10 \leq x \leq 15$, $0 \leq n \leq 2$),
where R represents two or more elements belonging to at least two different groups selected from the groups consisting of a rare earth element group, an alkaline-earth metal element group, and a group 4 element group, and the rare earth element group consists of La, Ce, Pr, and Yb, the alkaline-earth metal element group consists of Ca and Ba, and the group 4 element group consists of Ti,
R optionally contains a group 13 element consisting of Al and In,
T represents at least one element selected from Fe and Co,
M represents at least one element selected from the group consisting of Ru, Os, Rh, Ir, Ni, Pd, Pt, Cu, Ag, and Au,
X represents Sb, and
N represents at least one element selected from Se and Te,
wherein either m or n in $Ga_{0.1}R_{r-0.1}T_{t-m}M_m X_{x-n}N_n$ is larger than 0, and
wherein
said joining member is a joining layer including an alloy layer made of at least one alloy selected from the group consisting of a titanium alloy that contains 50 wt % or more and less than 100 wt % of Ti, and more than 0 wt % and 50 wt % or less of at least one element of Al, Ga, In and Sn; a cobalt alloy that contains 50 wt % or more and less than 100 wt % of Co, and more than 0 wt % and 50 wt % or less of Ti; and an iron alloy that contains 50 wt % or more and less than 100 wt % of Fe, and more than 0 wt % and 50 wt % or less of Ti.

2. The thermoelectric conversion module as claimed in claim 1, wherein a difference in thermal expansion coefficient at 20 to 600° C. between said thermoelectric conversion material and said alloy layer of said joining member located closest to said thermoelectric conversion material is equal to or larger than 0% and equal to or smaller than 20% with respect to a value of a thermal expansion coefficient of said thermoelectric conversion material.

3. The thermoelectric conversion module as claimed in claim 1, wherein said alloy layer has a thermal expansion coefficient that is equal to or greater than $8 \times 10^{-6}$ (/K) and equal to or smaller than $15 \times 10^{-6}$ (/K) at 20 to 600° C.

4. The thermoelectric conversion module as claimed in claim 1, wherein said electrode contains an alloy selected from the group consisting of titanium alloys, nickel alloys, cobalt alloys, and iron alloys.

5. The thermoelectric conversion module as claimed in claim 1, wherein
said electrode is a metal or an alloy having a thermal expansion coefficient that is equal to or greater than $8 \times 10^{-6}$ (/K) and equal to or smaller than $15 \times 10^{-6}$ (/K) at 20 to 600° C.

6. The thermoelectric conversion module as claimed in claim 1, wherein
said electrode is made of an alloy having the same composition as said alloy layer.

7. The thermoelectric conversion module as claimed in claim 1, wherein
T in $Ga_{0.1}R_{r-0.1}T_{t-m}M_m X_{x-n}N_n$ ($0.1 < r \leq 1$, $3 \leq t-m \leq 5$, $0 \leq m \leq 0.5$, $10 \leq x \leq 15$, $0 \leq n \leq 2$) is composed of Fe and Co.

8. The thermoelectric conversion module as claimed in claim 1, wherein
R in $Ga_{0.1}R_{r-0.1}T_{t-m}M_m X_{x-n}N_n$ ($0.1 < r \leq 1$, $3 \leq t-m \leq 5$, $0 \leq m \leq 0.5$, $10 \leq x \leq 15$, $0 \leq n \leq 2$) represents three or more elements belonging to at least three different groups selected from the groups consisting of the rare earth element group, the alkaline-earth metal element group, and the group 4 element group.

9. The thermoelectric conversion module as claimed in claim 1, wherein R further contains In.

10. The thermoelectric conversion module as claimed in claim 1, wherein a temperature range for use of the thermoelectric conversion material is from room temperature to 600° C.

* * * * *